United States Patent
Sandhu et al.

(10) Patent No.: US 9,979,385 B2
(45) Date of Patent: May 22, 2018

(54) CIRCUIT AND METHOD FOR MONITORING CORRELATED ELECTRON SWITCHES

(71) Applicant: ARM Ltd., Cambridge (UA)

(72) Inventors: Bal S. Sandhu, Fremont, CA (US); Robert Aitken, San Jose, CA (US); George Lattimore, Austin, TX (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 14/875,357

(22) Filed: Oct. 5, 2015

(65) Prior Publication Data

US 2017/0099049 A1 Apr. 6, 2017

(51) Int. Cl.
*H03K 17/687* (2006.01)
*G11C 11/00* (2006.01)
*G11C 13/00* (2006.01)
*G11C 29/02* (2006.01)
*G11C 29/04* (2006.01)

(52) U.S. Cl.
CPC ......... *H03K 17/687* (2013.01); *G11C 13/004* (2013.01); *G11C 29/026* (2013.01); *G11C 29/028* (2013.01); *G11C 2013/0045* (2013.01); *G11C 2013/0054* (2013.01); *G11C 2029/0409* (2013.01)

(58) Field of Classification Search
CPC .............. G11C 13/0069; G11C 13/004; G11C 13/0064; G11C 13/0097; G11C 16/26; G11C 16/32; G11C 16/08
USPC ....................... 327/427; 365/148, 222, 185.2
See application file for complete search history.

(56) References Cited

U.S. PATENT DOCUMENTS

| | | |
|---|---|---|
| 7,002,832 B2 | 2/2006 | Wuidart |
| 7,298,640 B2 | 11/2007 | Chen et al. |
| 7,639,523 B2 | 12/2009 | Celinska et al. |
| 7,778,063 B2 | 8/2010 | Brubaker et al. |
| 7,796,417 B1 | 9/2010 | Lewis |
| 7,872,900 B2 | 1/2011 | Paz de Araujo et al. |
| 8,773,887 B1 | 7/2014 | Naji |
| 9,392,661 B2 | 7/2016 | Schiappelli |

(Continued)

FOREIGN PATENT DOCUMENTS

| | | |
|---|---|---|
| WO | 2008/058264 A2 | 5/2008 |
| WO | 2013/148357 A1 | 10/2013 |

(Continued)

OTHER PUBLICATIONS

Celinska, Jolant et al., "Material and process optimization of correlated electron random access memories", Journal of Applied Physics, American Institute of physics, US, vol. 109, No. 9, May 13, 2011, 7 pages.

(Continued)

*Primary Examiner* — Thomas Skibinski
(74) *Attorney, Agent, or Firm* — Berkeley Law & Technology Group, LLP

(57) ABSTRACT

A monitoring circuit for a CES element is provided. The circuit includes a control circuit and an output circuit. The control circuit is configured to vary a control signal provided to the CES element. The control signal may be varied for determining an impedance state of the CES element. The output circuit provided an output signal in dependence on the determined impedance state of the CES element.

16 Claims, 6 Drawing Sheets

(56) References Cited

U.S. PATENT DOCUMENTS

| | | | |
|---|---|---|---|
| 2004/0227166 A1* | 11/2004 | Portmann | G11C 7/14 257/222 |
| 2005/0110476 A1 | 5/2005 | Mukherjee | |
| 2005/0207237 A1* | 9/2005 | Isobe | G11C 29/02 365/189.11 |
| 2005/0281073 A1 | 12/2005 | Cho | |
| 2006/0033525 A1* | 2/2006 | Mair | H03K 17/6872 326/33 |
| 2007/0047961 A1 | 3/2007 | Inoue | |
| 2007/0262795 A1 | 11/2007 | Apsel | |
| 2008/0106925 A1* | 5/2008 | Paz de Araujo | H01L 45/04 365/148 |
| 2008/0106926 A1 | 5/2008 | Brubaker | |
| 2008/0107801 A1 | 5/2008 | Celinska et al. | |
| 2009/0315525 A1 | 12/2009 | Nascimento | |
| 2011/0075473 A1 | 3/2011 | Park | |
| 2011/0122684 A1 | 5/2011 | Sheu et al. | |
| 2011/0128773 A1* | 6/2011 | Azuma | G11C 13/0007 365/148 |
| 2013/0285699 A1 | 10/2013 | McWilliams et al. | |
| 2013/0294136 A1 | 11/2013 | Siau | |
| 2014/0063897 A1 | 3/2014 | Guo | |
| 2014/0078811 A1 | 3/2014 | Kawai et al. | |
| 2014/0269003 A1 | 9/2014 | Guillemenet | |
| 2015/0325624 A1 | 11/2015 | Roizin | |
| 2017/0045905 A1 | 2/2017 | Sandhu | |
| 2017/0047919 A1 | 2/2017 | Sandhu | |

FOREIGN PATENT DOCUMENTS

| | | | |
|---|---|---|---|
| WO | WO 2013148357 A1 * | 10/2013 | G11C 7/14 |
| WO | 2014/020478 A2 | 2/2014 | |
| WO | 2015/125473 A1 | 8/2015 | |

OTHER PUBLICATIONS

PCT/GB2016/052516, Application as filed Aug. 12, 2016, 42 pages.
PCT/GB2016/052516, International Search Report and Written Opinion, dated Nov. 16, 2016, 16 pages.
PCT/GB2016/052517, International Search Report and Written Opinion, dated Nov. 14, 2016, 11 pages.
PCT/GB2016/053082, Application as filed Oct. 4, 2016, 21 pages.
PCT/GB2016/053082, International Search Report and Written Opinion, dated Dec. 20, 2016, 14 pages.

* cited by examiner

_US 9,979,385 B2_

CIRCUIT AND METHOD FOR MONITORING CORRELATED ELECTRON SWITCHES

TECHNICAL FIELD

The present disclosure relates to correlated electron switches (CES).

BACKGROUND

Non-volatile memories are a class of memory in which the memory cell or element does not lose its state after power supplied to the device is removed. The earliest computer memories, made with rings of ferrite that could be magnetized in two directions, were non-volatile, for example. Current non-volatile memories fall into two categories of read only memories (ROM) and random access memories (RAM).

SUMMARY OF THE PRESENT DISCLOSURE

The various embodiments and examples of the present disclosure as presented herein are understood to be illustrative of the present disclosure and not restrictive thereof and are non-limiting with respect to the scope of the present disclosure.

According to an embodiment, an apparatus is provided. The apparatus includes a CES element. The apparatus further includes a control circuit. The control circuit may be configured to vary a control signal provided to the CES element to determine an impedance state of the CES element. The apparatus further includes an output circuit. The output circuit may be configured to provide an output signal in dependence with the determined impedance state of the CES element.

According to another embodiment, a method is provided. The method comprises providing a control signal to a CES element. The method further comprises monitoring an output voltage at an output node and identifying the impedance state of the CES element based on the output signal.

According to yet another embodiment, a storage element is provided. The storage element may comprise a plurality of CES elements and a circuit. The circuit may be configured to selectively couple to one CES element from the plurality of CES elements. The circuit may comprise a control circuit and an output circuit. The control circuit may be configured to vary a control signal provided to the CES element to determine the state of the CES element. The output circuit may be configured to provide an output signal in dependence on the determined state of the CES element.

Further particular and preferred aspects of the present disclosure are set out in the accompanying independent and dependent claims. Features of the dependent claims may be combined with features of the independent claims as appropriate, and in combinations other than those explicitly set out in the claims.

DETAILED DESCRIPTION OF THE EMBODIMENTS

Particular aspects of the present disclosure incorporate a Correlated Electron Material (CEM) to form a correlated electron switch (CES). In this context, a CES may exhibit an abrupt conductive/insulative state transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CES memory device may be understood in any one of several aspects.

Figure 1:
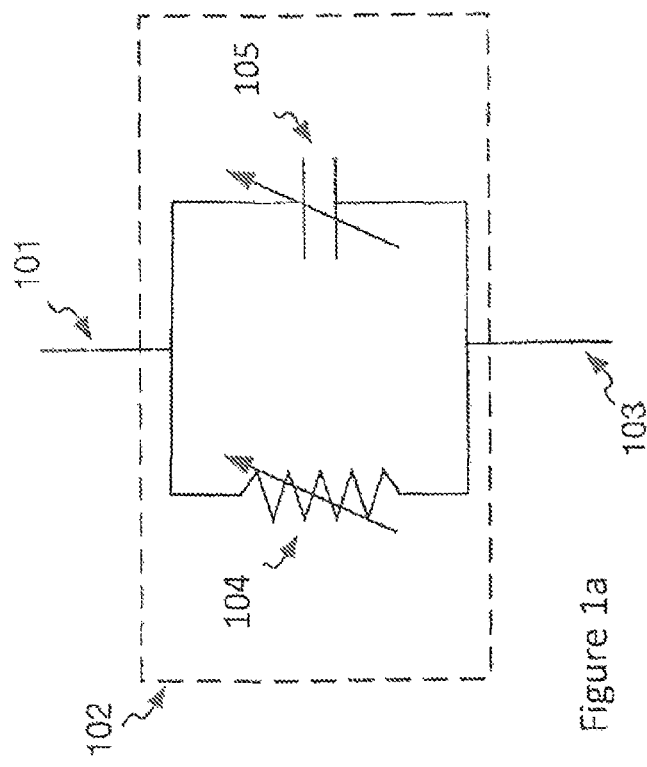
FIG. 1a illustrates an equivalent circuit for a CES.
FIG. 1b illustrates a truth table for a CES.

The transition from high resistance/capacitance to low resistance/capacitance can be represented by a singular impedance of the device. FIG. 1a depicts a schematic diagram of an equivalent circuit of an example variable impeder device, such as variable impeder device 102. As mentioned, a variable impeder device may comprise characteristics of both variable impedance and variable capacitance. For example, an equivalent circuit for a variable impeder device may, in an embodiment, comprise a variable resistor, such as variable resistor 104 in parallel with a variable capacitor, such as variable capacitor 105. Of course, although a variable resistor 104 and variable capacitor 105 are depicted in FIG. 1a as comprising discrete components, a variable impeder device, such as variable impeder device 102, may comprise a substantially homogenous CEM, such as CEM 102, wherein the CEM comprises characteristics of variable capacitance and variable resistance. FIG. 1b depicts an example truth table for an example variable impeder device, such as variable impeder device 102. The CES may be in In particular implementations of aspects of this disclosure, a resistive switching integrated circuit memory may comprise: a resistive switching memory cell including a CES device; a write circuit for placing the resistive switching memory cell in a first impedance state or a second impedance state depending on signals provided to the memory device, wherein an impedance of a CES is higher in the second impedance state than in the first impedance state; and a read circuit for sensing the state of the memory cell and providing an electrical signal corresponding to the sensed state of the memory cell. In one aspect, an impedance of a CES in the second memory cell state may be more than 100 times the impedance in the second memory cell state.

In a particular embodiment, a CES device may be formed as a "CES random access memory (CES)" device. In this context, a CES device comprises a material that may transition between or among a plurality of predetermined detectable memory states based, at least in part, on a transition of at least a portion of the material between a conductive state and an insulative state. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

Some embodiments may be used to read a data value which is stored in a CES device. Data may be written to the CES device using a variety of methods examples of which can be are described in co-owned U.S. patent application Ser. No. 14/826,064 Programmable Voltage For Correlated Electron Switch and/or co-owned U.S. patent application Ser. No. 14/826,091 Programmable Current For Correlated Electron Switch which are incorporated herein by reference.

Figure 2:
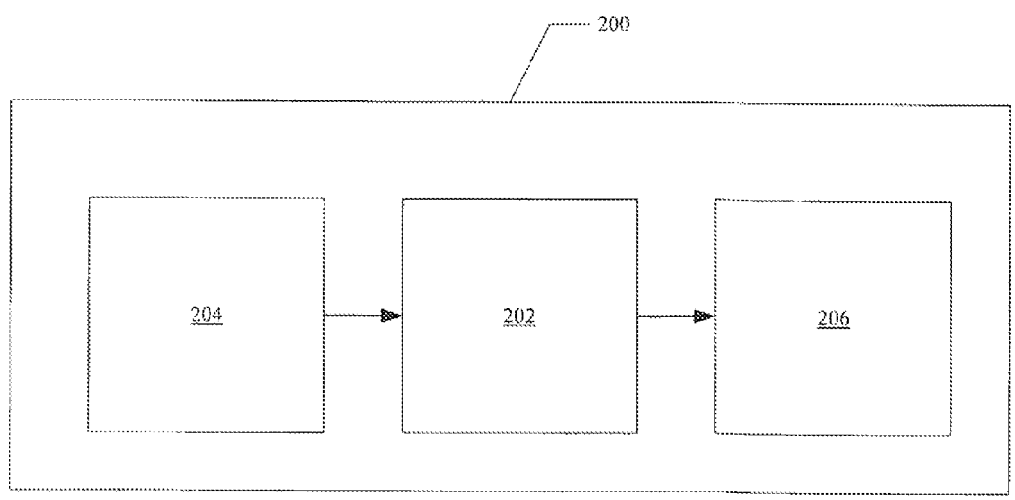
FIG. 2 illustrates an overview of an example circuit for monitoring the CES element.

FIG. 2 illustrates an overview of an example circuit 200 for monitoring a CES element 202. The circuit 200 may comprise a control circuit 204 coupled to the CES element 202. The control circuit 204 may vary a control signal to the CES element 202 to determine an impedance state of the CES element 202. The control signal, in an example, may be a reference current or a reference voltage provided to the CES element 202. The CES element 202 is further coupled to an output circuit 206. The output circuit 206 generates an output signal that is dependent on the determined impedance state of the CES element 202. The impedance state may include a resistive state, a capacitive state or a combination thereof. Further, the output signal may also be dependent upon a read signal associated with the CES element 202. The read signal associated with the CES element 202 may be at least one of a read voltage or a read current. The output signal, in an example, may be an output voltage.

Figure 3:
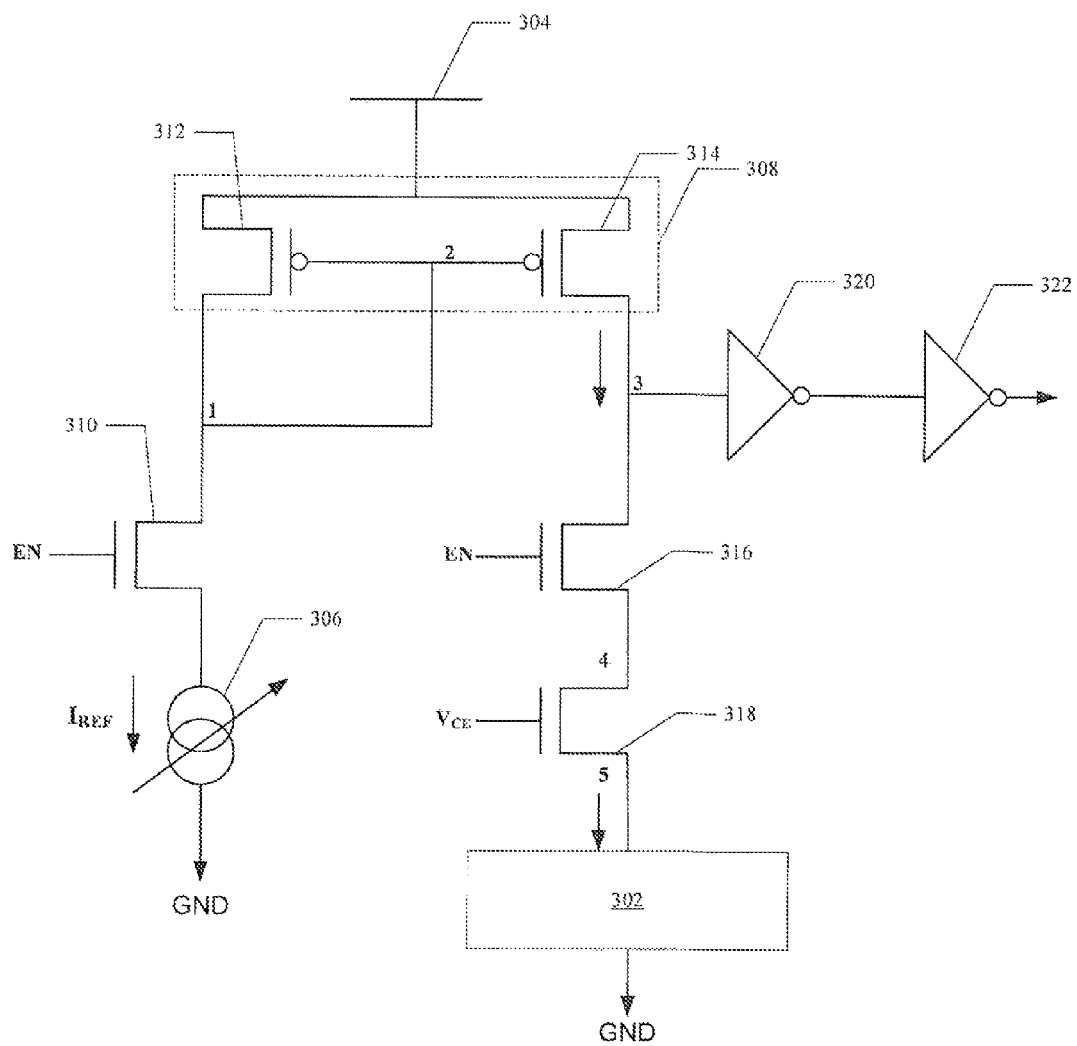
FIG. 3 illustrates an example circuit for monitoring the CES element.

FIG. 3 illustrates an embodiment comprising a circuit 300 for monitoring a CES element 302. The circuit 300 comprises a power source 304, a current source 306, and a current mirror 308. The power source 304 may be a supply voltage VDD. In an example, VDD equals 1.2V. The current source 306 provides as an output a control signal which is received as an input by the CES element 302 In some embodiments the control signal may be a reference current (IREF). In some embodiments, the current source 306 may be a current output digital to analog converter (DAC) configured to digitally control the reference current flowing into the circuit 300. The current source 306 is coupled to a transistor 310. The current source 306, the current mirror 308 and the transistor 310 may be collectively referred to as the control circuit. The transistor 310 receives an enable signal EN at a gate input. When a value of the enable signal EN exceeds the switching threshold of the transistor 310 and/or reaches a logic level 1, the transistor 310 switches ON allowing the reference current to flow through the transistor 310. The current mirror may control the amount of current which flows thorough the transistor 310, thus setting the current flow through one side of the current mirror 308.

The current mirror 308 comprises an input branch having a transistor 312 and an output branch having a transistor 314. The transistor 312 mirrors the reference current onto node 2, which is further copied through the transistor 314 to provide a first current through an output node (for example, node 3). The first current is substantially equal to the reference current. In some embodiments the circuit 300 may comprise one or more current mirror stages to mirror the reference current to the output node.

The circuit 300 further comprises transistors 316, 318 and inverters 320, 322. The transistors 316, 318 and the inverters 320, 322 may collectively form an output circuit. The transistor 316 also receives EN at a gate input. The transistor 316 is coupled to the transistor 318, which in turn is coupled to the CES element 302. The transistor 318 receives an analog voltage, denoted by VCE at a gate input of the transistor 318. When EN is at VDD, transistor 316 conducts and applies VDD at node 4. VCE may be designed in a manner such that a voltage drop Vth across the transistor 318 limits a voltage at node 5 to VDD−Vth so that the CES element 302 may not accidentally switch the impedance state during a read operation. The voltage at node 5 is a read voltage for the CES element. In some embodiments, the read voltage may be set between about 0.4 volts to about 0.5 volts. Depending upon the impedance state and the read voltage, a read current flows through the CES element 302 (interchangeably referred to as a second current or a CES current ICES). This read current flows through node 3, transistors 316, 318 and the CES element 302. Thus, the first current and the second current flow through node 3. Consequently, a voltage at node 3 depends upon the first current and the second current. The voltage at node 3 passes through the two inverters 320 and 322 to output an output voltage.

As the second current depends upon the impedance state of the CES element 302, and the output voltage depends upon the first current and the second current, the output voltage may be indicative of the impedance state of the CES element 302. In one implementation, when the first current is greater than the second current, node 3 is pulled high to VDD, i.e., to 1.2 volts in one example. Consequently, the output voltage too is at VDD (or at logic level one). Similarly, when the second current is greater than the first current, the output voltage at node 3 is pulled down to GND. Consequently, the output voltage too is at GND (or at logic level zero). The reference current may be set such that the reference current is greater that the CES current when the CES element 302 is in a high impedance state and such that the reference current is smaller than the CES current when the CES element 302 is in a low impedance state. Thus, when the output voltage is at the logic level 1, the output voltage is indicative of the CES element being in the high impedance state and when the output voltage is at the logic level 0, the output voltage is indicative of the CES element 302 being the low impedance state.

In one embodiment, another transistor (not shown) may be coupled to the transistor 316 in parallel. In an example, the transistor may be a Negative Channel Field Effect Transistors (NFET). Such a configuration, in an example, may provide for a current density required while reading the CES element 302. In an example, one or both transistors may be switched ON during reading the CES element 302.

In an example, the impedance state of the CES element 302 may be a resistance state. The resistance state may include a high resistance state (or a reset state) and a low resistance state (or a set state). Resistive values for the CES element 302, for example, may be in the order of 100 kilo-ohms in the low resistance state and in the order of 10 mega-ohms in the high resistance state. Further, in an example, programming voltages required to program the CES element 302 in the high impedance state and in the low impedance state may be around 0.6 volts and around 1.2 volts, respectively. Similarly, current flowing through the CES element 302 may be in the order of 100-200 nano-amperes when programmed in the high impedance state and in the order of 35-40 micro-amperes when programmed in the low impedance state, according to one example implementation.

Figure 4:
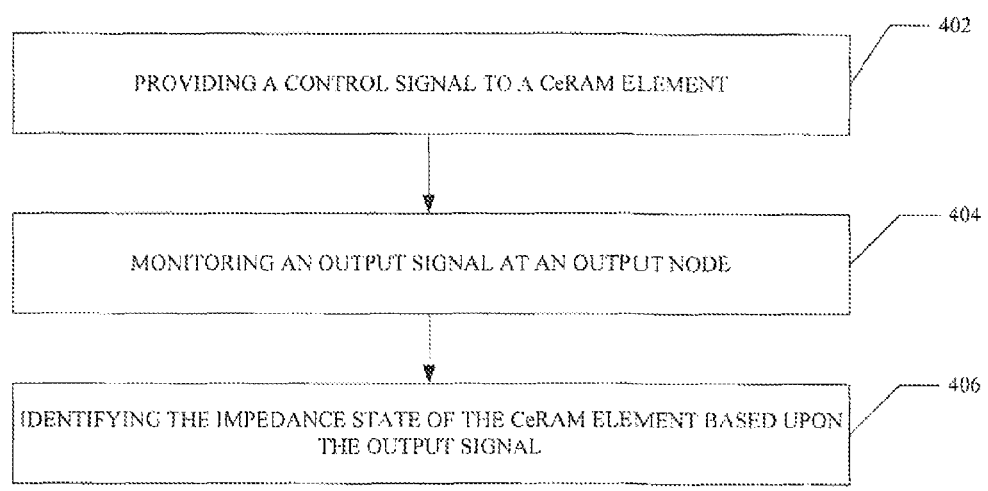
FIG. 4 illustrates a method for identifying an impedance state of the CES element.

FIG. 4 depicts an example method 400 for monitoring a CES element. The method 400 starts at step 402, where a control signal is provided to the CES element. The control signal, in an example, may be a reference current. The reference current may be digitally controlled using a digital to analog converter (DAC). At step 404, an output signal is monitored at an output node. The output signal, for example, may be an output voltage across the output node. At step 406, the impedance state of the CES element is identified based upon the output signal. In an example, the impedance state may include a resistance state, a capacitance state, or a combination thereof. Further, the impedance state may include a high impedance state and a low impedance state. Referring to the example, where the output signal is the output voltage, the CES element may be determined to be in the high impedance state when the output voltage is at a logic level one and in the low impedance state when the output voltage is at a logic level zero.

In an embodiment, a voltage drop between the output node and the CES element may be provided. The voltage drop, in an example, may be provided by coupling a transistor between the output node and the CES element. In another example, the voltage drop may be provided by coupling a diode between the output node and the CES element. The voltage drop may be provided so that a voltage across the CES element is less than a first threshold voltage for the CES element. In an example, the first threshold voltage may be a reset voltage for the CES element.

In another embodiment, the control signal may be varied from a first value to a second value. Based on the variation in the control signal, a transition of the output signal from a first logic level to a second logic level may be detected. Further, a programming current of the CES element, may be determined based on the transition in the output signal.

Figure 5:
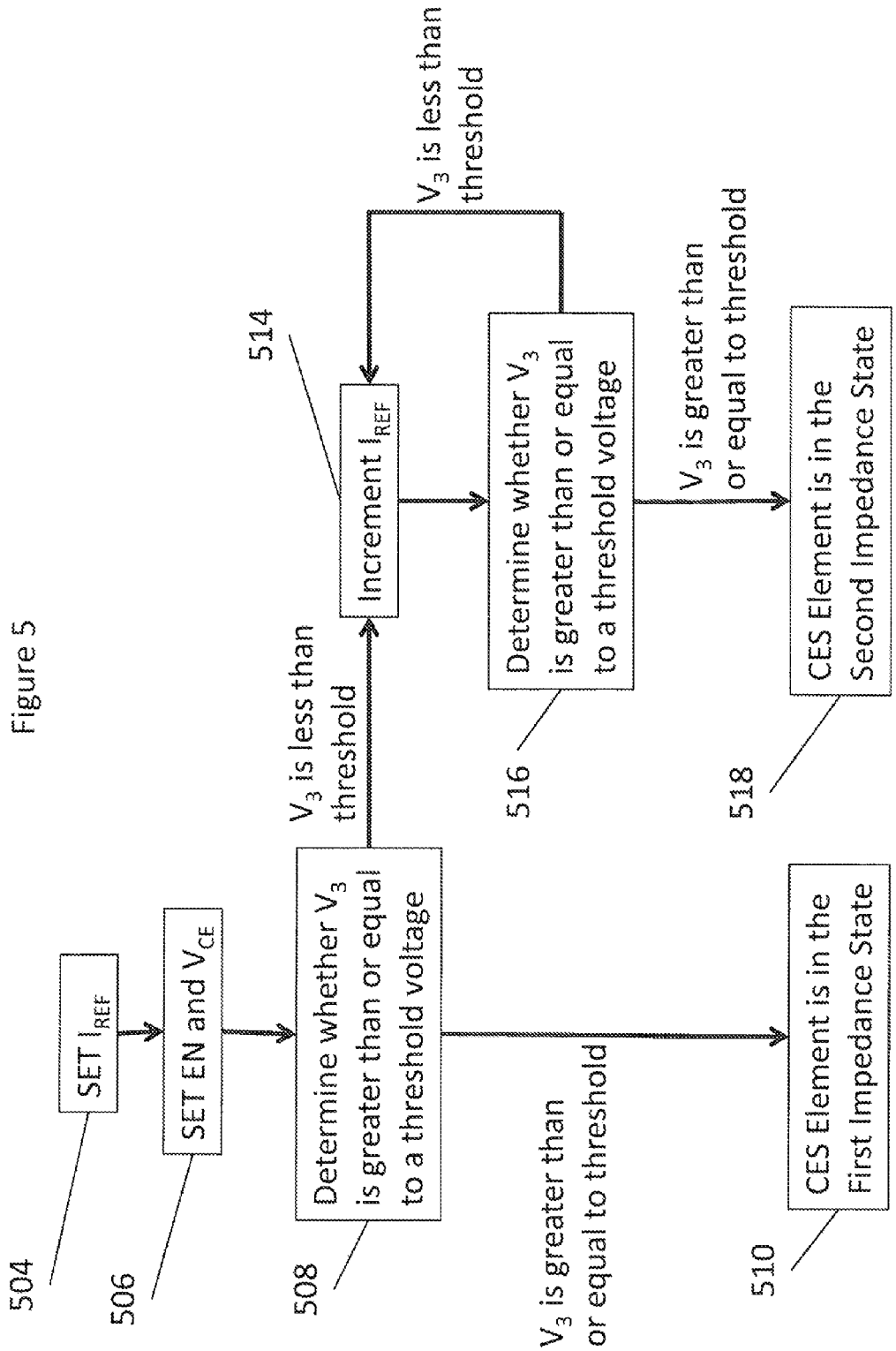
FIG. 5 illustrates an example method for measuring a read current through the CES element.

FIG. 5 illustrates an example method 500 for measuring the read current and determining the impedance state of a CES element, such as the CES element 302. The method 500 may be used in conjunction with the circuit 300 as described in the foregoing. At step 504 the reference current IREF is set. At Step 506 the enable voltage EN and the analog voltage VCE for transistor 318 are set. In some embodiments the value of VCE is such that it the voltage at node 5 is lower than the reset voltage of the CES element 302. This may reduce the risk of the value stored in the CES being disturbed when the value is read. Once the value of IREF is set and the transistors 310 and 316 are enabled, IREF flows through node 1 into the current mirror 308, such that transistor 312 of the current mirror copies IREF to node 2. This copied current then flows through the transistor 314, generating the first current. The first current, in an implementation, is substantially equal to IREF. As described in the foregoing, the second current that is dependent on the impedance state of the CES element 302, flows from the CES element 302 into the transistors 316 and 318 and into node 3.

At step 508 a determination is made as to whether V3 is greater than or equal to a threshold voltage. If V3 is equal to or exceeds the threshold voltage, the method progresses to step 510 which indicates that the CES is in a first impedance state. If at step 508 the outcome of the determination is that V3 is less than or equal to the threshold voltage, the method proceeds to step 514 where the value of the reference voltage IREF is incremented. At step 516 a determination is made as to whether V3 is greater than or equal to a threshold voltage. If V3 is equal to or exceeds the threshold voltage, the method progresses to step 518 which indicates that the CES is in a second impedance state. If at step 516 the outcome of the determination is that V3 is less than or equal to the threshold voltage, the method returns to step 514.

In some embodiments the first impedance state may be the high impedance state and the second impedance state may be the low impedance state. In other embodiments the first impedance state may be the low impedance state and the second impedance state may be the high impedance state.

In an example embodiment, the following values may be used: at step 504, the reference current IREF, from the current source 306, may be set to about 1 microampere. At step 506, enable signal EN for both transistors 310 and 316 may be set to about 1.2 volts. As described in the foregoing, the reset voltage for the CES element 302 may be around 0.6 volts. To avoid accidental resetting of the CES element 302, the voltage at node 5 may be set lower than 0.6 volts, for example, at about 0.5 volts. To achieve this, the analog voltage, VCE, for transistor 318 may be set to about 0.8 volts. Further, the transistor 318 may be selected in a manner such that a threshold voltage across the transistor 318 is about 0.3 volts, thereby keeping the voltage at node 5 at about 0.5 volts. The output voltage is measured in step 508 and is compared whether the output voltage equals about 1.2 volts. In an implementation, when the first current is greater than the second current, node 3 is pulled high to $V_{DD}$, i.e., 1.2 volts and hence, the output voltage is about 1.2 volts. As the second current is of the order of 100-200 nano-amperes, when the CES element 302 is in the high impedance state, thus when the output voltage is equal to about 1.2 volts, the impedance state of the CES element 302 is determined as a high impedance state, at step 510. The method then stops at step 512. On the other hand, if the output voltage is not equal to about 1.2 volts, the method 500 proceeds to step 514. At step 514, $I_{REF}$ is incremented by a determined step, for example, by 1 microampere. At step 516, it is checked whether the output voltage is equal to about 1.2 volts. If it is determined that the output voltage does not equal about 1.2 volts as checked at 516, the method 500 goes back to step 514, where $I_{REF}$ is further incremented by 1 microampere. This procedure where, $I_{REF}$ is continuously incremented by 1 microampere, is repeated until an instance where the first current becomes greater than the second current and node 3 is pulled high to 1.2 volts. It is determined that the CES element is in the low impedance state at step 518. Further, the value of $I_{REF}$, at which node 3 (and the output voltage) is pulled to 1.2 volts for the CES element 302, may be indicative of the read current flowing through the CES element 302, in the low impedance state.

Figure 6:
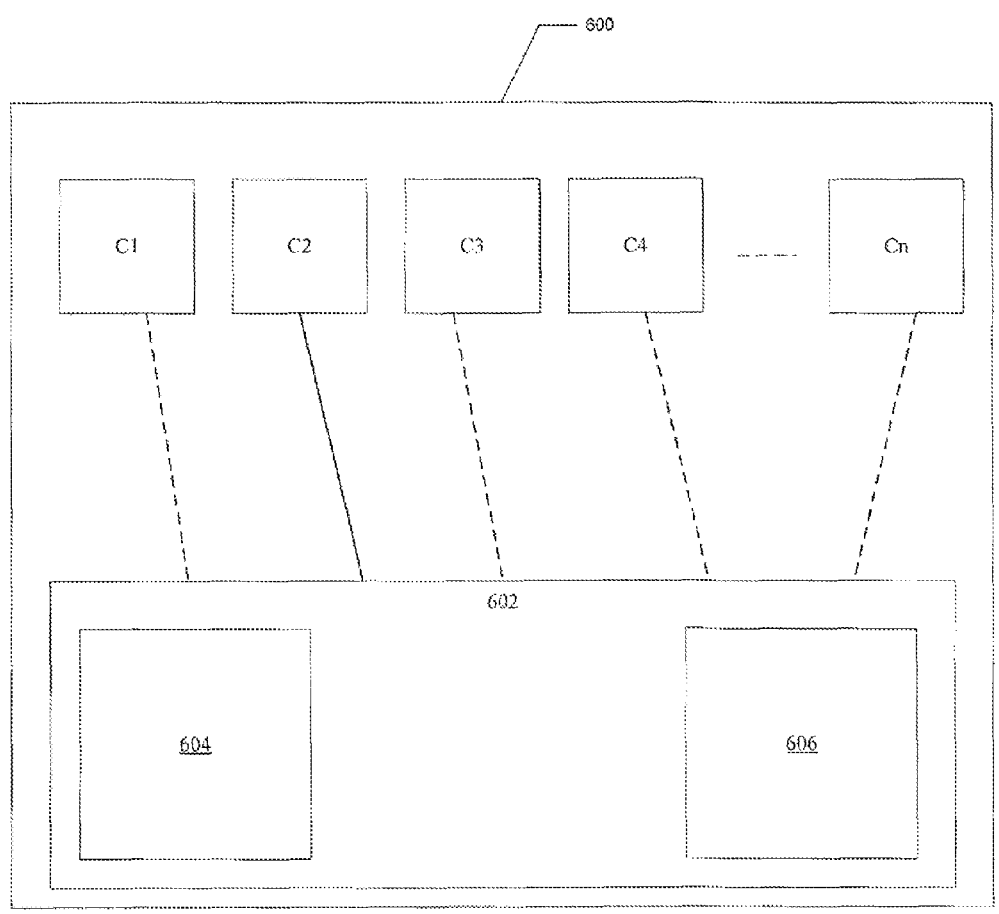
FIG. 6 illustrates an example storage element comprising one or more CES elements.

FIG. 6 illustrates an example storage element 600 in accordance with embodiments of the present disclosure. The storage element 600 may comprise a plurality of CES elements. These are denoted by C1, C2, C3 . . . Cn in the figure. The storage element 600 may further include a circuit 602 for monitoring one or more of the plurality of CES elements. The circuit 602 may be selectively coupled to one CES element of the plurality of CES elements. In an example shown in FIG. 6, element C2 is connected to the circuit 602 and all other CES elements are disconnected. The circuit 602 may monitor the CES element C2. Thereafter, the circuit 602 may be coupled to another one of the plurality of CES elements, for example, C3 to monitor the another one of the plurality of CES elements. The circuit 602 may further include a control circuit 602 and an output circuit 604. The control circuit 602 may be configured to vary a control signal provided to the one or more CES elements to which the circuit 602 is connected. The control signal, in an example, may be a reference current. In an implementation, the control signal may be provided to the one or more CES elements to determine the impedance states of the one or more CES elements.

The circuit 602 may further include an output circuit 606. The output circuit 606 may be configured to provide an output signal. The output signal may be based on the determined impedance states of the one or more CES elements. In an example, the output signal may be an output voltage. The output signal may be measured to identify impedance states of the one or more CES elements. The output signal may also be used to determine the programming current of the one or more CES elements currently connected to the circuit 602. In an example, the circuit 602 may be implemented using the circuit 300.

Embodiments of the present invention may further be used to monitor one or more parameters associated with a CES element. For example, a read margin of a CES element may be determined using circuit elements described in the foregoing. The read margin may be indicative of whether or not a CES element is written to an optimum operating point. CES elements operating at an optimum point may exhibit better operational speeds. Further, the read margin may also determine whether a read voltage of the CES element can be reduced without affecting the performance of the CES element. Reduced read voltages may be useful for developing low power circuits for operating the CES elements. Further, process variation in different CES elements may be minimized by monitoring parameters such as impedance state, programming voltage and programming current.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
   a correlated electron switch element;
   a control circuit to incrementally vary a current level of a control signal provided to the correlated electron switch element by discrete amounts of about one microampere, to determine an impedance state of the correlated electron switch element based, at least in part on the incrementally varied current level of the control signal at an occurrence of a voltage condition; and
   an output circuit to provide an output signal in dependence on the determined impedance state of the correlated electron switch element.

2. The apparatus of claim 1, wherein the control circuit comprises:
   a current source to provide the control signal, wherein the control signal comprises a reference current;
   a current mirror circuit to mirror the reference current to produce a first current through an output node, the first current being substantially equal to the reference current; and
   a coupling circuit to couple the output node to the correlated electron switch element, the coupling circuit when enabled passes a second current through the output node and the correlated electron switch element, the second current being dependent upon at least the impedance state of the correlated electron switch element.

3. The apparatus of claim 2, wherein the coupling circuit comprises:
   a first transistor, coupled to the output node, to provide the second current; and
   a second transistor coupled to the first transistor and the correlated electron switch element, and configured to provide a voltage drop such that a voltage across the correlated electron switch element is less than a first threshold voltage of the correlated electron switch element.

4. The apparatus of claim 3, wherein the second transistor comprises a Negative Channel Field Effect Transistor (NFET).

5. The apparatus of claim 3, further comprising a third transistor coupled to the first transistor in parallel.

6. The apparatus of claim 2, wherein a voltage at the output node is at logic level one when the first current is greater than the second current.

7. The apparatus of claim 2, wherein a voltage at the output node is at logic level zero when the first current is less than the second current.

8. The apparatus of claim 2, wherein the current mirror circuit comprises two or more current mirror stages.

9. The apparatus of claim 1, wherein the control circuit comprises a current output digital to analog converter to digitally control a reference current.

10. A method comprising:
    incrementally varying a current level of a control signal to a correlated electron switch element by discrete amounts of about one microampere;
    monitoring an output signal at an output node; and
    determining an impedance state of the correlated electron switch element in dependence on the incrementally varied current level of the control signal as the output signal meets a voltage condition.

11. The method of claim 10, further comprising:
    providing a voltage drop between the output node and the correlated electron switch element such that a voltage across the correlated electron switch element is less than a first threshold voltage of the correlated electron switch element.

12. The method of claim 10, further comprising:
    incrementally varying the current level of the control signal from a first value to a second value;
    detecting a transition of the output voltage from a first logic level to a second logic level; and
    determining a programming current based, at least in part, upon the transition.

13. The method of claim 10, wherein the state of the correlated electron switch element is identified to be in a high impedance state when the output voltage is at logic level one.

14. The method of claim 10, wherein the state of the correlated electron switch element is identified as a low impedance state when the output voltage is at logic level zero.

15. The method of claim 10, wherein the incrementally varied current level of the control signal comprises a current level that is digitally controlled using a digital to analog converter.

16. A storage element comprising:
    a plurality of correlated electron switch elements; and
    a circuit, selectively coupled to one correlated electron switch element of the plurality of the correlated electron switch elements, the circuit comprising:
      a control circuit to incrementally vary a current level of a control signal provided to the one correlated electron switch element by discrete amounts of about one microampere, to determine an impedance state of the one correlated electron switch element based, at least in part, on the incrementally varied current level of the control signal at an occurrence voltage condition; and an output circuit to provide an output signal in dependence on the determined impedance state of the one correlated electron switch element.

* * * * *